United States Patent
Purdham et al.

(10) Patent No.: US 8,181,100 B1
(45) Date of Patent: May 15, 2012

(54) MEMORY FAULT INJECTION

(75) Inventors: David M. Purdham, Eden Prairie, MN (US); Larry L. Byers, Apple Valley, MN (US); Thomas F. Koehmstedt, Shakopee, MN (US)

(73) Assignee: Marvell International Ltd., Hamilton (BM)

( * ) Notice: Subject to any disclaimer, the term of this patent is extended or adjusted under 35 U.S.C. 154(b) by 774 days.

(21) Appl. No.: 12/359,159

(22) Filed: Jan. 23, 2009

Related U.S. Application Data

(60) Provisional application No. 61/026,857, filed on Feb. 7, 2008.

(51) Int. Cl.
*G06F 7/02* (2006.01)

(52) U.S. Cl. ...................................................... 714/819

(58) Field of Classification Search .................. 714/758, 714/763
See application file for complete search history.

(56) References Cited

U.S. PATENT DOCUMENTS

| | | | |
|---|---|---|---|
| 5,907,566 A * | 5/1999 | Benson et al. ................. | 714/798 |
| 6,182,248 B1 * | 1/2001 | Armstrong et al. ............. | 714/43 |
| 6,397,357 B1 * | 5/2002 | Cooper ......................... | 714/703 |
| 7,779,334 B2 * | 8/2010 | Earle et al. .................... | 714/763 |
| 2002/0157044 A1 * | 10/2002 | Byrd ............................. | 714/703 |
| 2004/0225932 A1 * | 11/2004 | Hoda et al. .................... | 714/703 |
| 2004/0243887 A1 * | 12/2004 | Sharma et al. ................. | 714/52 |
| 2008/0052603 A1 * | 2/2008 | Wiatrowski et al. ........... | 714/776 |

\* cited by examiner

*Primary Examiner* — Robert Beausoliel, Jr.
*Assistant Examiner* — Neil Miles

(57) ABSTRACT

Techniques, apparatus, and systems for injecting a memory fault can include obtaining first data and second data different from the first data, generating first error detection information based on the first data, writing the second data to a memory unit using a specified address, and using the first error detection information as error detection information for the second data to create a memory fault condition.

19 Claims, 8 Drawing Sheets

MEMORY FAULT INJECTION

CROSS REFERENCE TO RELATED APPLICATIONS

This application claims the benefit of the priority of U.S. Provisional Application Ser. No. 61/026,857, filed Feb. 7, 2008 and entitled "Method of Injecting Known Faults in a Memory," the entire contents of which are hereby incorporated by reference.

BACKGROUND

The present disclosure describes systems and techniques relating to memory fault injection.

Devices and systems can include a processing device and one or more memory devices or units such as random-access-memory (RAM) or read-only memory (ROM). Memory devices and units can include non-volatile memory, e.g., flash memory. Examples of devices and systems include computer systems, servers, hard disk drive (HDD) systems, set-top-boxes, media devices, MP3 players, and mobile devices.

A processing device can execute code such as firmware, a program, or operating system located in one or more of the memory areas. For example, the firmware can instruct a processing device to read from and write to a memory area of a memory device or unit. In some implementations, devices and systems can use error detection information such as parity bits or error correction codes (ECCs) to at least detect corrupted memory when reading from memory.

SUMMARY

The present disclosure includes systems, apparatuses, and techniques that can inject memory faults into a memory.

Systems, apparatuses, techniques for memory fault injection can include obtaining first data and second data, where the second data differs from the first data; generating first error detection information based on the first data; writing the second data to a memory unit using a specified address; and using the first error detection information as error detection information for the second data to create a memory fault condition.

These, and other aspects, can include one or more of the following features. Features can include reading data from the memory unit at the specified address, e.g., causing a processing unit to read data from the memory unit at the specified address; and observing the processing unit for a memory fault, e.g., observing a processing unit for a memory fault. Using the first error detection information as error detection information for the second data can include writing the first error detection information data to the memory unit as error detection information data for the second data. Features can include writing corrective data to the memory unit to clear the memory fault condition. Generating the first error detection information can include generating parity bits based on the first data. Generating the first error detection information can include generating an error correction code based on the first data.

Some implementations can generate second error detection information based on the second data, and can select between inputs based on a state of a fault injection register to write error detection information to the memory unit. The inputs can include the first error detection information and the second error detection information. Some implementations can access status information stored in a data area to make a memory fault injection determination. The status information can signal the creation of the memory fault condition. Accessing status information can include accessing a fault injection register or a general purpose register. Some implementations can reset the status information to clear signaling of the creation of the memory fault condition. Resetting the status information can include resetting a fault injection register. Setting a flag selected from multiple flags can select a memory area of one or more memory units for corruption. A fault injection register can store the flag. Some implementations can write the first data to the memory unit at the specified address. Writing the second data to the memory unit can include overwriting the first data.

The described systems, apparatuses, and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, the disclosed embodiment(s) below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a mobile telephone, a personal digital assistant (PDA), a mobile computer, a digital camera), a general purpose data processing apparatus (e.g., a minicomputer, a server, a mainframe, a supercomputer), or combinations of these.

Thus, according to another aspect of the described systems, apparatuses, and techniques, a system can include a memory unit; and a processing unit communicatively coupled with the memory unit. The processing unit can perform operations including obtaining first data and second data, where the second data differs from the first data; generating first error detection information based on the first data; writing the second data to a memory unit using a specified address; and using the first error detection information as error detection information for the second data to create a memory fault condition.

This, and other aspects, can include one or more of the following features. Using the first error detection information as error detection information for the second data can include writing the first error detection information data to the memory unit as error detection information data for the second data. The operations can also include reading data from the memory unit at the specified address and observing for a memory fault. The operations can also include accessing status information stored in a data area to make a memory fault injection determination, e.g., the status information signals the creation of the memory fault condition. The operations can also include accessing firmware stored in a memory unit. The firmware can specify a setting of a fault injection register to signal the creation of the memory fault condition. The firmware can store a write instruction that identifies the specified address.

An apparatus for injecting memory faults can include a memory port to access a memory unit, an error detection information register to store error detection information for data written to the memory unit, a fault injection register to control an injection of corrupt error detection information into the memory unit; and a controller unit to control the memory unit. The controller unit can communicatively couple with the memory port, the error detection data register, and the fault injection register.

The controller unit can perform operations including obtaining first data and second data—the second data differs from the first data, generating first error detection information based on the first data, writing the second data to the memory unit using a specified address; and selectively using the first error detection information as error detection information for the second data based on a state of the fault injection register. Using the first error detection information as error detection information for the second data can include writing the first error detection information data to the memory unit as error detection information data for the second data. The controller unit can also perform operations including generating second error detection information based on the second data; and selecting between inputs based on the state of the fault injection register to write error detection information to the memory unit. The inputs can include the first error detection information and the second error detection information.

The subject matter described in this specification can be implemented to realize one or more of the following potential advantages. Injecting a fault before a subsequent read operation can increase the read bandwidth of the device when compared with post-read corrupting techniques, e.g., accessing and, then, corrupting data. The programmable nature of the fault injection register can enable code such as firmware or a program to dynamically test one or more memories. For example, a program can execute multiple fault detection tests by running through multiple one-bit or n-bit permutations of data written to a memory. The fault injection register resetting feature can reduce instructions generated by a testing program. Storing previous error detection data can reduce the latency when writing to a memory to create a memory fault.

Details of one or more implementations are set forth in the accompanying drawings and the description below. Other features, objects, and advantages may be apparent from the description and drawings, and from the claims.

DRAWING DESCRIPTIONS

Like reference symbols in the various drawings indicate like elements.

DETAILED DESCRIPTION

Devices and systems that process data may depend on reliable data retrieval. When a processing device stores data to memory, the processing device can expect the data to be identical when returned in a future read operation. However, data may become corrupted. Devices and systems can use error detection information such as ECCs and parity bits to detect corrupted data. In some implementations, using ECCs can correct 1-bit or n-bit data corruptions. A mismatch between error detection information and associated data can invoke a fault handler during a read operation. Firmware can include code for a fault handler. A processing device can include logic for a fault handler or support to invoke a firmware based fault handler.

Memory should be tested to ensure reliable data retrieval or at least detection of corrupted data. Memory testing can include injecting a memory fault condition into a memory unit and observing a fault during a subsequent read. A device or system's firmware can control a processing device to inject a memory fault condition. Fault injection techniques can allow for different types of faults such as correctable fault injections or fatal fault injections. Techniques can allow any bit or bits in a data range, e.g., a word, to be corrupted. In some implementations, fault injection techniques can include setting a control register to bypass or disable an automatic ECC correction mechanism to allow a memory fault to be observed during a read operation; otherwise, such an automatic ECC correction mechanism may correct an injected fault before a processing device has an opportunity to observe the injected fault.

Figure 1:
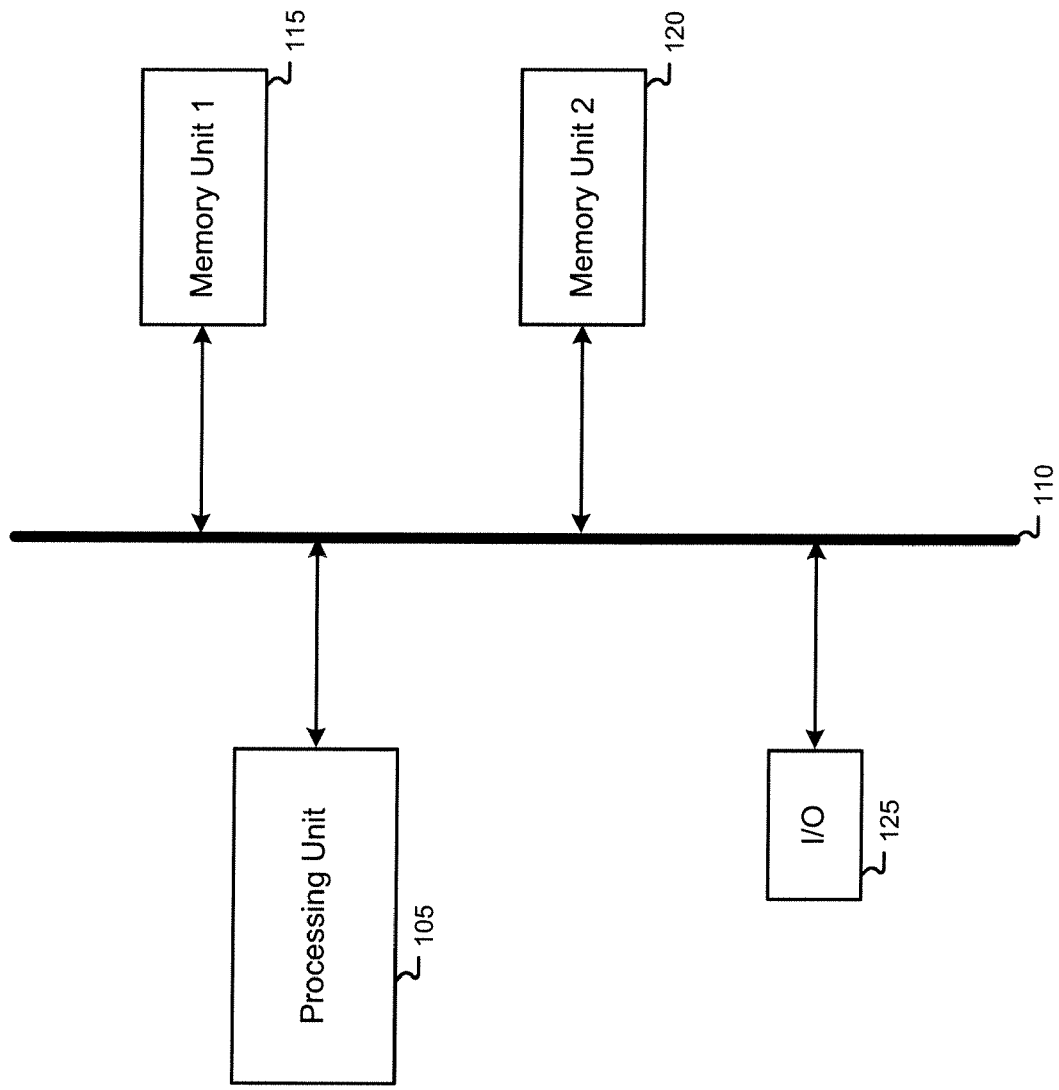
FIG. 1 shows an example of a processing system.

FIG. 1 shows an example of a processing system. Processing unit 105 can communicate with one or more memory units such as memory unit 115 and memory unit 120 through a communication channel such as a bus 110. A processing unit 105 can include one or more of processing logic, general purpose Central Processing Unit (CPU), control CPU, or a servo CPU. Additional processing units can connect to bus 110. In some implementations, the processing unit 105 can communicate through an input/output (I/O) port 125 with devices such as a hard disk drive (HDD), network interfaces (e.g., Ethernet, wireless), monitor, keyboard, or pointing device. A HDD can store programs for controlling processing unit 105.

In some implementations, memory units 115, 120 can include one or more of code RAM, flash memory, ROM, static random access memory (SRAM), and system instruction ROM (SIROM). In some implementations, memory unit 120 can store firmware that controls the processing unit 105. In some implementations, memory unit 120 can include system instruction tightly coupled memory (SITCM) and memory unit 115 can include system data tightly coupled memory (SDTCM).

Memory units 115, 120 can store error detection information such as error correcting codes (ECCs) or parity information. Error detection information can cover one or more bits worth of data. In some implementations, a control CPU can communicate with a SITCM that uses word ECC, a SDTCM that uses byte ECC, a SRAM that uses byte ECC, and a SIROM that uses word parity. A servo CPU can communicate with instruction tightly coupled memory (ITCM) that uses word parity and with data tightly coupled memory (DTCM) that uses byte parity.

Figure 2:
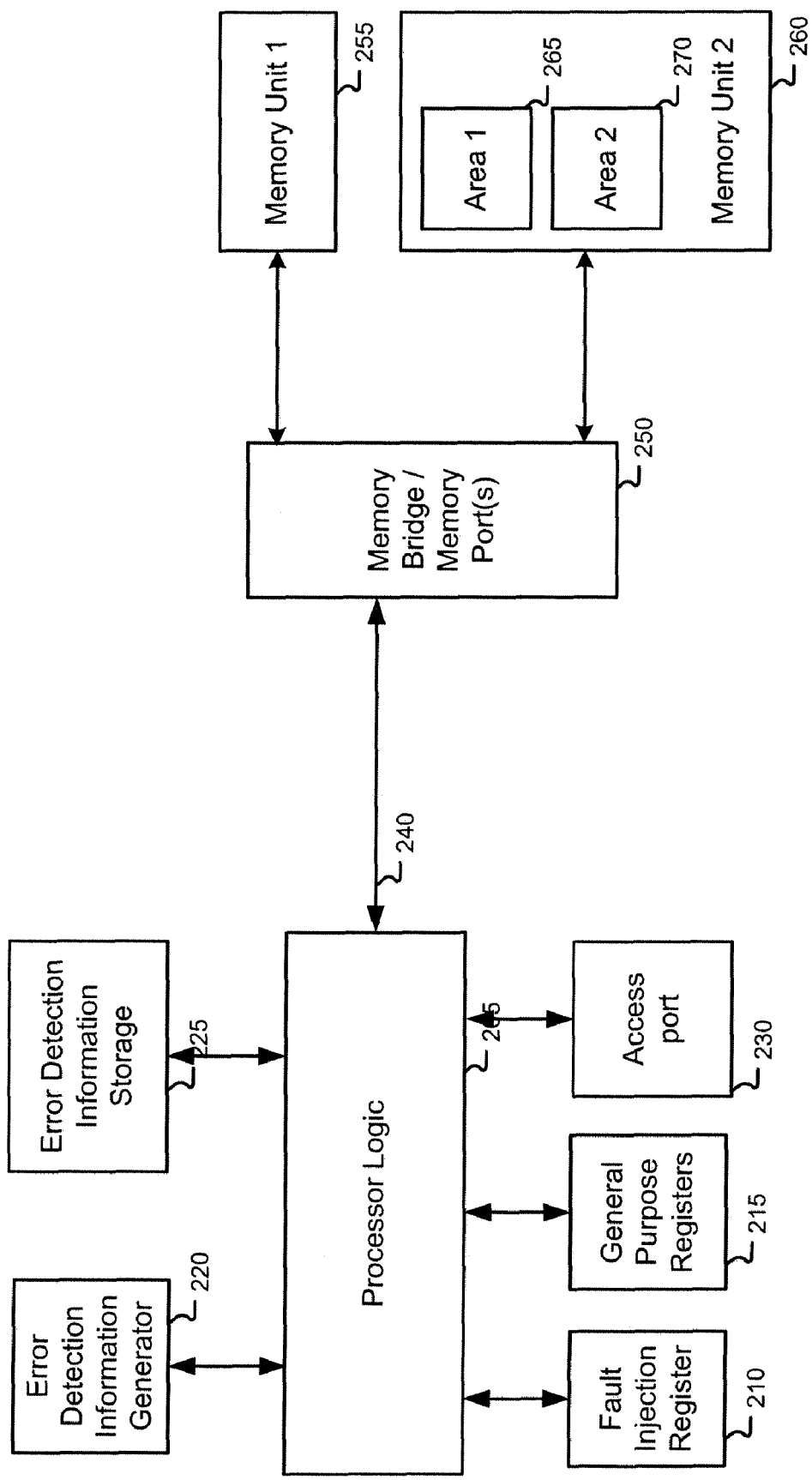
FIG. 2 shows an example of a fault injection system including a fault injection register.

FIG. 2 shows an example of a fault injection system including a fault injection register. A system can include processor logic 205, a fault injection register 210, general purpose registers 215, error detection information generator 220, and error detection information storage 225. In some implementations, a system can include an access port 230 to allow external control of the processor logic 205 and associated storage areas and memory. An error detection information generator 220 can generate ECC or parity information for write operations to a memory unit 255, 260. Error detection information storage 225 can store data from the error detection information generator 220.

Processor logic 205 can communicate with one or more memory units 255, 260 via a memory bridge 250 with one or more memory ports. A communication bus 240 can connect processor logic 205 with memory bridge 250. A memory unit 260 can include multiple memory areas 265, 270. In some implementations, processor logic 205 can store error detection information in a memory area separate from the corresponding data. In some implementations, processor logic 205 can store error detection information along with corresponding data in the same memory area.

A fault injection register 210 can signal the creation of a memory fault condition in one or more memory units 255, 260. A state of the fault injection register 210 can determine how processor logic 205 switches between using current or previous error detection information when writing error detection information to a memory unit 255, 260. In some implementations, processor logic 205 can multiplex between output from the error detection information generator 220 and error detection information storage 225 based on a state of the fault injection register 210. In some implementations, a true indication of the fault injection register 210 can cause processor logic 205 to select error detection information storage 225, and as a result, creates a mismatch between data and associated error detection information after writing to memory unit 255, 260 to create the memory fault condition.

In some implementations, setting a fault injection register 210 with a flag selected from multiple flags can select a memory area of one or more memory units for corruption to create a memory fault condition. In some implementations, a fault injection register 210 can include multiple bit positions for selecting different memories for corruption. For example, setting the second bit of the register can indicate a pending fault injection to a SDTCM whereas setting the fifth bit of the register can indicate a pending fault injection to an ITCM. In some implementations, register 210 can include a bit to indicate a pending fault injection for a SIROM such that a subsequent read from the SIROM uses a corrupted parity bit to trigger a memory fault.

Figure 3:
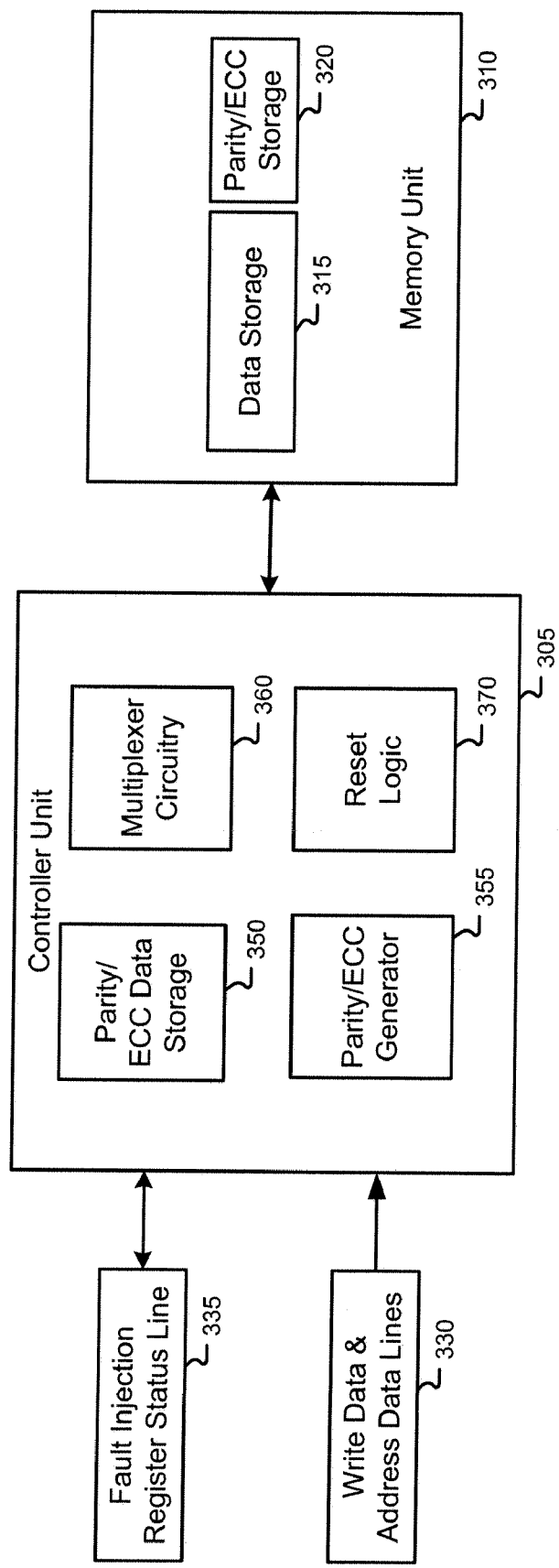
FIG. 3 shows an example of a controller unit coupled with a memory unit.

FIG. 3 shows an example of a controller unit coupled with a memory unit. A controller unit 305 can communicate with a memory unit 310. Memory unit 310 can include data storage 315 and parity/ECC storage 320. The controller unit 305 can receive status over a fault injection register status line 335 from a processing unit. The controller unit 305 can receive data over write data and address data lines 330 from a processing unit or different device.

The controller unit 305 can include storage 350 for parity or ECC data, a generator 355 to generate parity or ECC data, multiplexer circuitry 360 to select output from one of storage 350 and generator 355 when writing to memory unit 310. In some implementations, a controller unit 305 can include reset logic 370 to clear the fault injection register after creating a memory fault condition.

Figure 4:
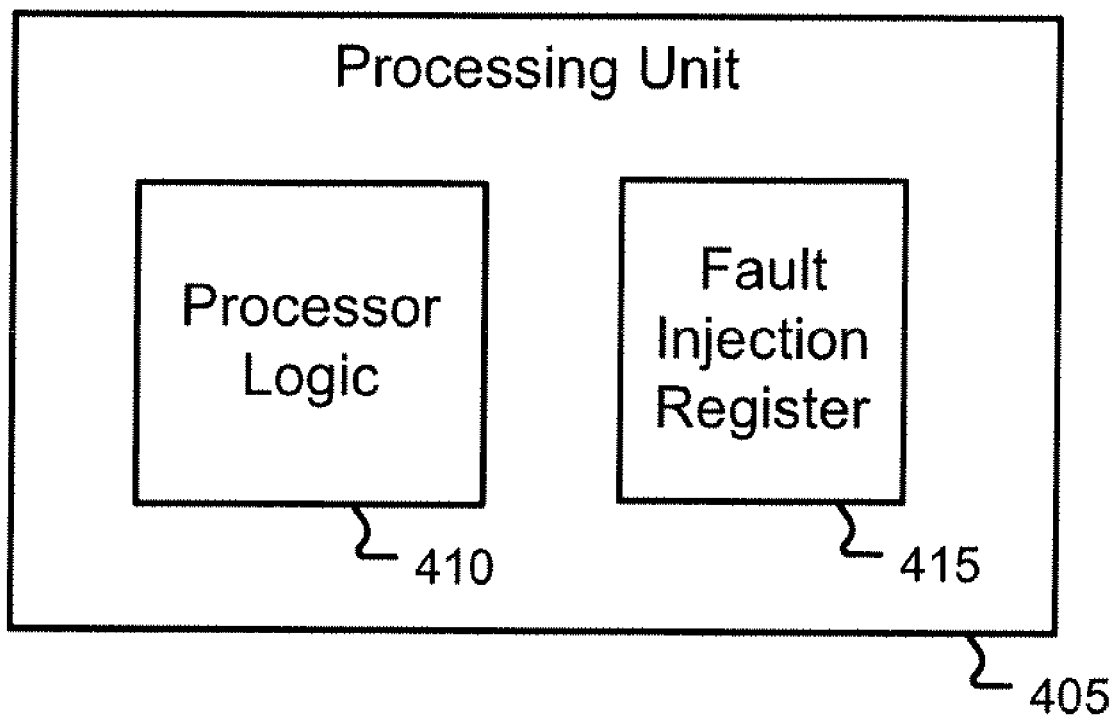
FIG. 4 shows an example of a fault injection register embedded within a processing unit.

FIG. 4 shows an example of a fault injection register embedded within a processing unit. A processing unit 405 can include processor logic 410 and a fault injection register 415. In some implementations, a fault injection register 415 is a general purpose register reserved for creating memory faults. In some implementations, a fault injection register 415 is a separate register. In some implementations, a fault injection register can include multiple bits to respectively corrupt different memories. For example, a true indication in a specified bit position of the fault injection register can indicate a pending memory fault injection for the memory associated with the specified bit position.

Figure 5:
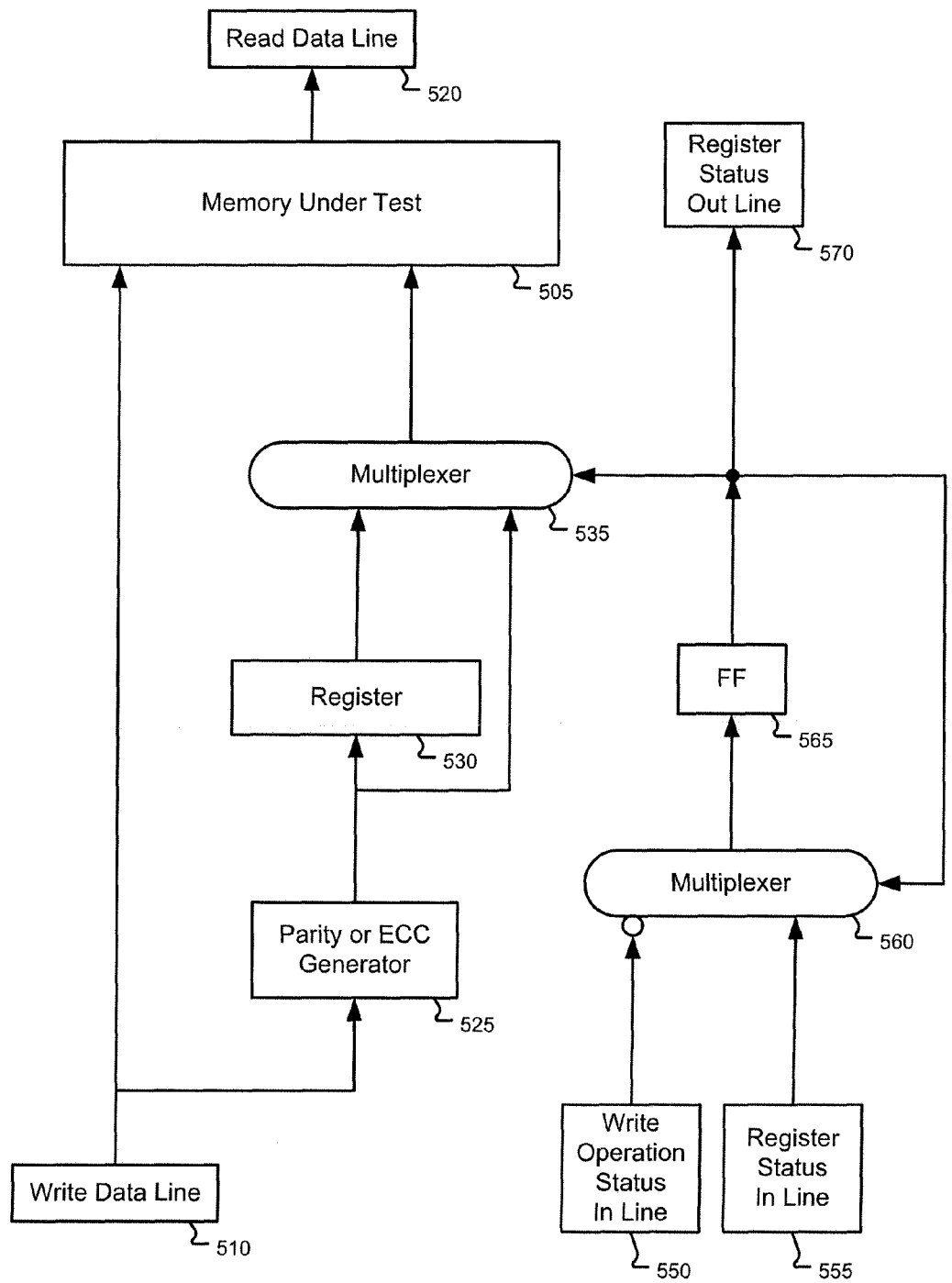
FIG. 5 shows an example of a system for testing memory.

FIG. 5 shows an example of a system for testing memory. A system can couple a write data line 510 and a read data line 520 between a memory 505 under test and a processing unit. A parity or ECC generator 525 can generate error detection information for data coming over the write data line 510. Register 530 can store the output of generator 525. Multiplexer 535 can select between register 530 and generator 525 outputs for writing error detection information to memory 505. Multiplexer 535 can use an output from flip-flop (FF) 565 to select between inputs. The output of flip-flop 565 can also update a fault injection register via a register status output line 570. Flip-flop 565 can use an output from multiplexer 560 to update an internal state. Inputs to multiplexer 560 can include a write operation status in line 550 and a fault injection register status line 555. Multiplexer 560 can use an output from flip-flop 565 to select between inputs.

In some implementations, memory 505 under test can include a code RAM. A system's processing unit, executing firmware or a program, can select a desired memory location/address such as a code RAM address to corrupt data in memory 505. The processing unit can write uncorrupted data word to a specified address in a memory 505 with data from generator 525. The processing unit can write to one or more bits of a fault injector register to select a memory for corruption such that the ECC code or parity captured in register 530 may be written to memory 505 on a next write. Setting a bit of a fault injector register can result in the assertion of a signal for one clock cycle over the status in line 555 to multiplexer 560.

A system's processing unit can generate a corrupted data word (e.g., inverting one or two bits of the uncorrupted data word) and write the corrupted data to the selected code RAM location. If the output of flip-flop 565 is asserted, then multiplexer 535 can, instead of using the generated ECC code or parity information, use the ECC code or parity data from the register 530 to write data to memory 505. After writing corrupted data, the write operation status in line 550 asserts and clears the output from flip-flop 565 such that multiplexer 535 will use data from generator 525 for a subsequent write operation. One cycle later, the fault injector register can clear, e.g., a pending fault inject bit in the fault injector register clears. The system can read from the selected code RAM location/address to access the corrupted data and determine if expected system level behavior occurs.

Figure 6:
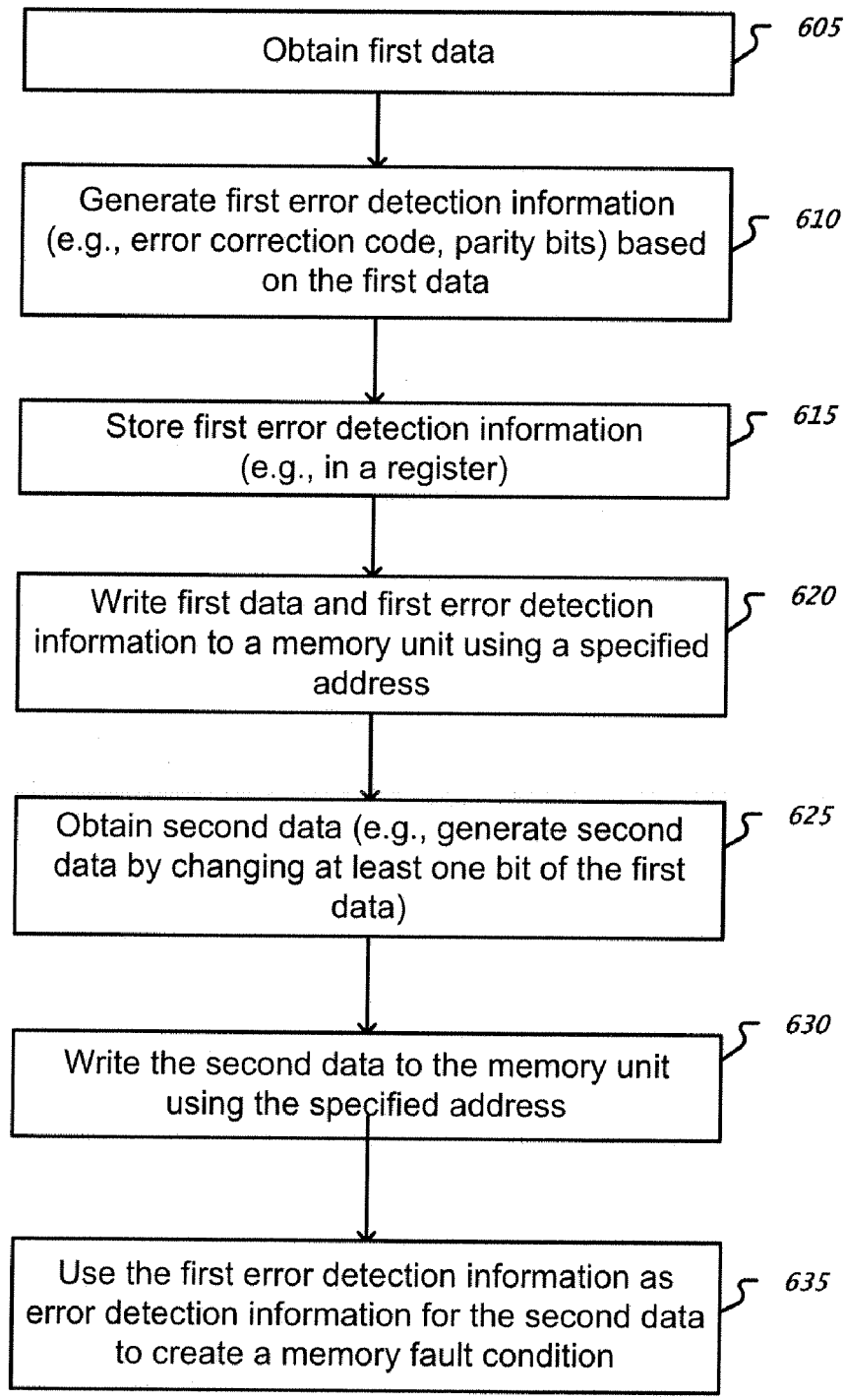
FIG. 6 shows an example of a process for creating a memory fault condition.

FIG. 6 shows an example of a process for creating a memory fault condition. At 605, the process can obtain first data, e.g., access a memory unit or generate data. A process can generate, at 610, first error detection information such as error correction code(s) or parity bits based on the first data and can store, at 615, the first error detection information in a storage area such as a register. Examples of a register include a general purpose register and a specialized register for storing error detection information. A processing unit can write, at 620, first data and first error detection information to a memory unit using a specified address, e.g., an address stored in a program or a generated address. In some implementations, the first error detection information can be stored in the memory unit, or in a different memory unit, in a memory area associated with the first data.

The process can obtain, at 625, second data. In some implementations, a processing unit can generate second data by changing one or more bits of the first data. In some implementations, a processing unit can generate the first and second data by setting respective first and second different bit positions or values.

A memory fault condition can include a mismatch between data and associated error detection information, e.g., error detection information that does not correspond to the data. To create a memory fault condition, the processing unit can write, at 630, the second data to the memory unit using the specified address and can use, at 635, the first error detection information as error detection information for the second data. In some implementations, at 630, writing second data overwrites the first data within the memory unit. In some implementations, at 635, using the first error detection information as error detection information for the second data can include maintaining the first error detection information as the second error detection information. Such maintaining can include overwriting the first error detection information stored in the memory unit with identical information.

Figure 7:
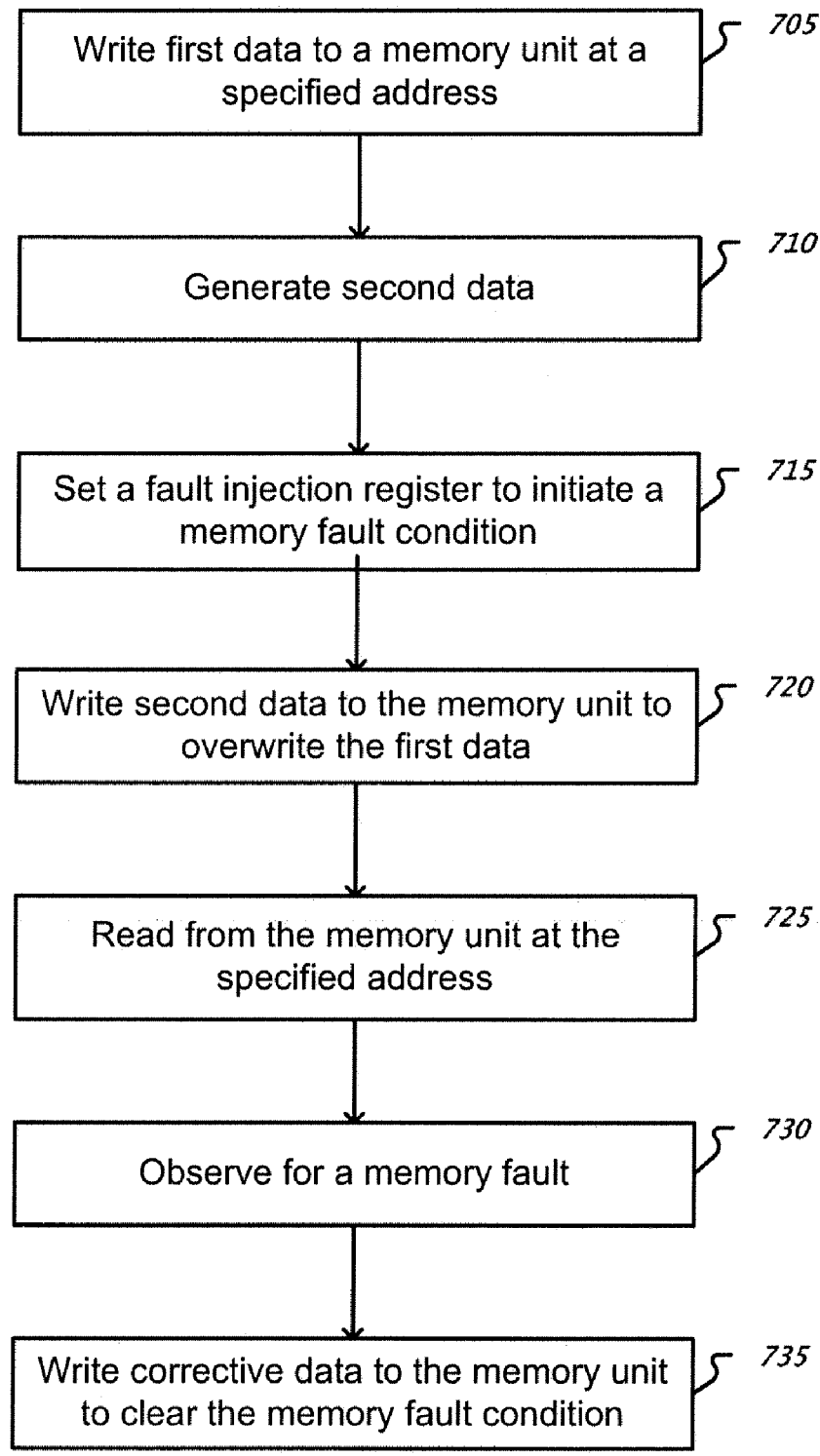
FIG. 7 shows an example of creating and observing a memory fault.

FIG. 7 shows an example of creating and observing a memory fault. A processing device such as a processing unit 105 or controller unit 305 can access and execute data such as firmware stored in a memory device. The firmware can include instructions to create a memory fault condition. The processing device can write, at 705, first data to a memory unit at a specified address. The firmware can specify a memory unit and the specified address. In some cases, the firmware can generate the specified address and the first data, e.g., through an iterative process. The processing device can generate, at 710, second data by, for example, changing at least one bit in the first data. To initiate a memory fault condition, the processing device can set, at 715, a fault injection register. In some implementations, a fault injection register can store multiple flags where each flag corresponds to a different memory area. A specific bit position in the register can store a flag. In some implementations, two or more specific bit positions in the register can store a flag such that different values of these bit positions can indicate different memory units. Some implementations can include a fault injection register for each memory unit in communication with a processing device.

The processing device can write, at 720, second data to the memory unit to overwrite the first data. The device can perform a second write using the specified address of the first write, at 705, to achieve the second write, at 720. Because of a state of the fault injection register, e.g., the state after setting, at 715, the fault injection register, the processing device can use error detection information for the first data as error detection information for the second data to create the memory fault condition. After the second write, at 720, the processing device can reset the fault injection register.

The firmware can direct the processing device to read, at 725, from the memory unit at the specified address. A memory fault handler can be programmed into the processing device to observe, at 730, for a memory fault. The firmware can include code for the memory fault handler. In some implementations, one or more thread(s) or process(es) can generate and write data to the memory unit, different thread(s) or process(es) can read, at 725, from the memory unit, and a different thread(s), process(es), or handler(s) can handle a memory fault. A memory unit's test result can be deemed successful if reading, at 725, from the memory unit at the specified address triggers a memory fault as a result of the mismatch between data and corresponding error detection information. Likewise, a test result can be deemed a failure if no memory fault results after reading, at 725, from the memory unit at the specified address. After observing the fault, the processing device can write, at 735, corrective data to the memory unit to clear the memory fault condition. The process of FIG. 7 can be repeated to produce test results for multiple different addresses of the memory unit.

Figure 8:
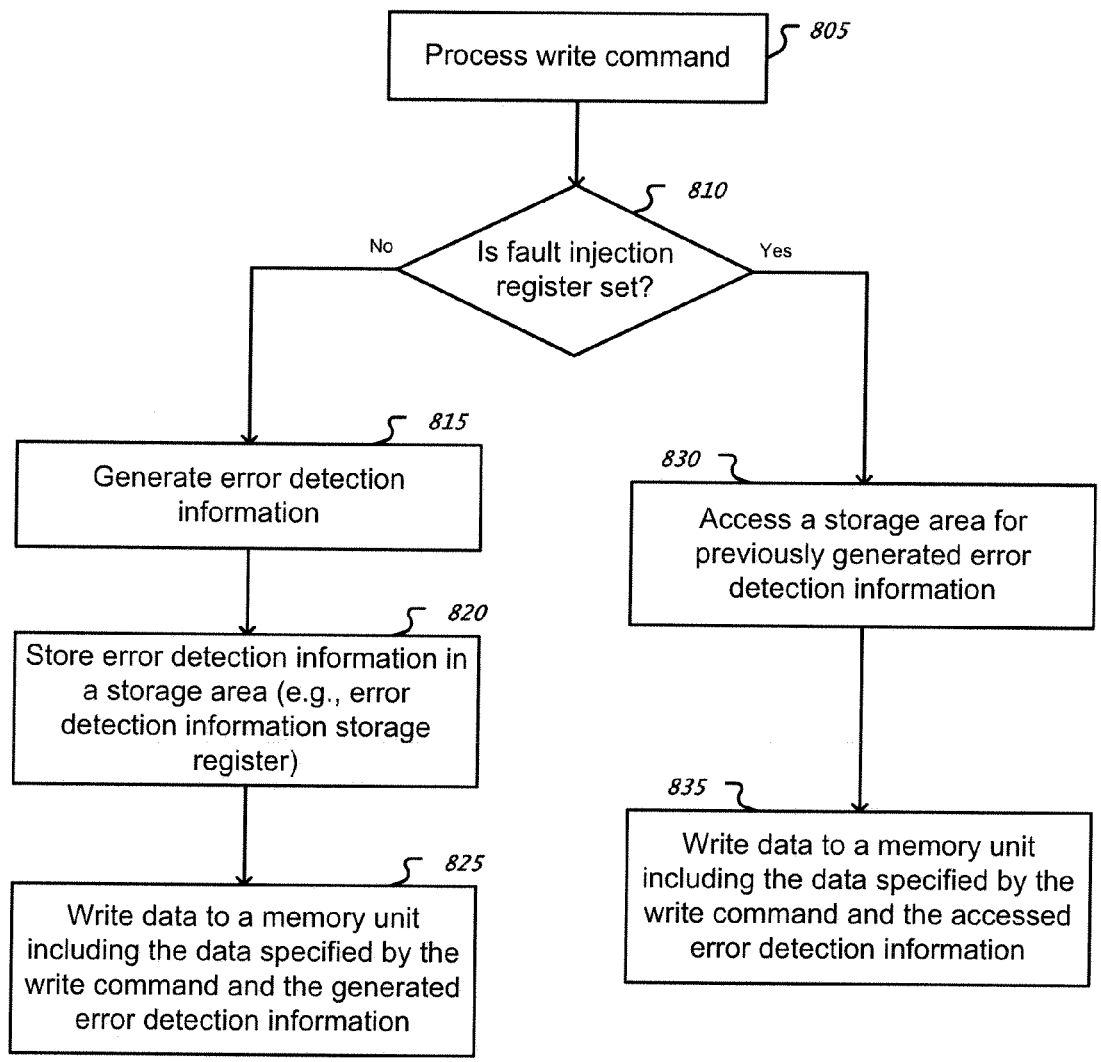
FIG. 8 shows an example of processing a write command.

FIG. 8 shows an example of processing a write command. In some implementations, memory fault injection can switch between on and off states and can change between write commands. As a result, a processing device can check a fault injection register status to make a memory fault injection determination. For example, a processing device can process a write command, at 805, e.g., receive a command to write data to a memory. At 810, the processing device can check a status of a fault injector register.

If the fault injector register is not set, at 810, then the processing device can generate, at 815, error detection information based on data specified by the write command. A storage area such as an error detection information storage register can store, at 820, the generated error detection information from 815. The processing device can write, at 825, data to a memory unit which can include the data specified by the write and the generated error detection information. In some implementations, the processing device can write, at 825, data to different memory units or to one memory unit.

If the fault injector register is set, at 810, then the processing device can access, at 830, a storage area such as an error detection information storage register for previously generated error detection information. The processing device can write, at 835, data to a memory unit including the data specified by the write command and the accessed error detection information. In some implementations, at 815, generating error detection information can occur regardless of outcome 810. In some implementations, at 835, the processing device can write data to different memory units or to one memory unit.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A method comprising:
   obtaining first data and second data, wherein the second data differs from the first data;
   generating first error detection information based on the first data;
   writing the second data to a memory unit using a specified address; and
   using the first error detection information as error detection information for the second data to create a memory fault condition.

2. The method of claim 1, further comprising:
   reading data from the memory unit at the specified address; and
   observing for a memory fault.

3. The method of claim 1, wherein using the first error detection information as error detection information for the second data comprises writing the first error detection information data to the memory unit as error detection information data for the second data.

4. The method of claim 3, further comprising:
   writing corrective data to the memory unit to clear the memory fault condition.

5. The method of claim 1, further comprising:
   accessing status information stored in a data area to make a memory fault injection determination, wherein the status information signals the creation of the memory fault condition.

6. The method of claim 5, further comprising:
   generating second error detection information based on the second data; and
   selecting between inputs based on a state of a fault injection register to write error detection information to the memory unit, wherein the inputs comprise the first error detection information and the second error detection information.

7. The method of claim 6, further comprising:
   resetting the status information to clear signaling of the creation of the memory fault condition.

8. The method of claim 1, further comprising:
   setting a flag selected from multiple flags to select a memory area of one or more memory units for corruption.

9. The method of claim 1, further comprising:
   writing the first data to the memory unit at the specified address, wherein writing the second data to the memory unit comprises overwriting the first data.

10. The method of claim 1, wherein generating the first error detection information comprises generating parity bits based on the first data.

11. The method of claim 1, wherein generating the first error detection information comprises generating an error correction code based on the first data.

12. An apparatus comprising:
    a memory port to access a memory unit;
    an error detection information register to store error detection information for data written to the memory unit;
    a fault injection register to control an injection of corrupt error detection information into the memory unit;
    a controller unit to control the memory unit, wherein the controller unit is communicatively coupled with the memory port, the error detection data register, and the fault injection register; and
    wherein the controller unit is configured to perform operations comprising:
       obtaining first data and second data, wherein the second data differs from the first data;
       generating first error detection information based on the first data;
       writing the second data to the memory unit using a specified address; and
       selectively using the first error detection information as error detection information for the second data based on a state of the fault injection register.

13. The apparatus of claim 12, wherein using the first error detection information as error detection information for the second data comprises writing the first error detection information data to the memory unit as error detection information data for the second data.

14. The apparatus of claim 12, wherein the controller unit is configured to perform operations comprising:
    generating second error detection information based on the second data; and selecting between inputs based on the state of the fault injection register to write error detection information to the memory unit, wherein the inputs comprise the first error detection information and the second error detection information.

15. A system comprising:
    a memory unit; and
    a processing unit communicatively coupled with the memory unit, wherein the processing unit is configured to perform operations comprising:
       obtaining first data and second data, wherein the second data differs from the first data;
       generating first error detection information based on the first data;
       writing the second data to the memory unit using a specified address; and
       using the first error detection information as error detection information for the second data to create a memory fault condition.

16. The system of claim 15, wherein the processing unit is configured to perform operations comprising:
  reading data from the memory unit at the specified address; and
  observing for a memory fault.

17. The system of claim 15, wherein using the first error detection information as error detection information for the second data comprises writing the first error detection information data to the memory unit as error detection information data for the second data.

18. The system of claim 15, wherein the processing unit is configured to perform operations comprising: accessing status information stored in a data area to make a memory fault injection determination, wherein the status information signals the creation of the memory fault condition.

19. The system of claim 15, wherein the processing unit is configured to perform operations comprising accessing firmware stored in a memory unit, wherein the firmware specifies a setting of a fault injection register to signal the creation of the memory fault condition, wherein the firmware stores a write instruction that identifies the specified address.

* * * * *